(12) United States Patent
Qu et al.

(10) Patent No.: US 9,263,515 B2
(45) Date of Patent: Feb. 16, 2016

(54) SUPER-JUNCTION SCHOTTKY PIN DIODE

(75) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 31 days.

(21) Appl. No.: 14/236,604

(22) PCT Filed: Jul. 19, 2012

(86) PCT No.: PCT/EP2012/064146
§ 371 (c)(1),
(2), (4) Date: May 14, 2014

(87) PCT Pub. No.: WO2013/017413
PCT Pub. Date: Feb. 7, 2013

(65) Prior Publication Data
US 2014/0239435 A1 Aug. 28, 2014

(30) Foreign Application Priority Data
Aug. 2, 2011 (DE) .......................... 10 2011 080 258

(51) Int. Cl.
| H01L 29/872 | (2006.01) |
| H01L 29/06 | (2006.01) |
| H01L 29/66 | (2006.01) |
| H01L 29/868 | (2006.01) |

(52) U.S. Cl.
CPC ........ *H01L 29/0634* (2013.01); *H01L 29/0649* (2013.01); *H01L 29/66143* (2013.01); *H01L 29/868* (2013.01); *H01L 29/872* (2013.01)

(58) Field of Classification Search
CPC ............ H01L 29/0619; H01L 29/0623; H01L 29/0642; H01L 29/0649; H01L 29/0634; H01L 29/868; H01L 29/872

USPC .................. 257/471, 476, 483, 484, 493, 591
See application file for complete search history.

(56) References Cited

U.S. PATENT DOCUMENTS 6,184,545 B1 * 2/2001 Werner et al. ................. 257/109
6,252,288 B1 * 6/2001 Chang ........................... 257/471

(Continued)

FOREIGN PATENT DOCUMENTS

DE          197 40 195          3/1999

OTHER PUBLICATIONS

Fujihira, "Theory of Semiconductor Superjunction Devices", Jpn. J. Appl. Phys. 36 (1997): pp. 6254-6262.*

(Continued)

*Primary Examiner* — Michele Fan
(74) *Attorney, Agent, or Firm* — Kenyon & Kenyon LLP

(57) ABSTRACT

A semiconductor chip has an $n^+$-doped substrate, above which an n-doped epilayer having trenches is introduced, the trenches being filled with p-doped semiconductor material and in each case having a highly p-doped region at their top side, such that an alternating arrangement of n-doped regions having a first width and p-doped regions having a second width is present. A first metal layer functioning as an anode is provided on the front side of the chip and forms a Schottky contact with the n-doped epilayer and forms an ohmic contact with the highly p-doped regions. A second metal layer which represents an ohmic contact and functioning as a cathode is formed on the rear side of the semiconductor chip. A dielectric layer is provided between each n-doped region and an adjacent p-doped region.

9 Claims, 5 Drawing Sheets

(56) References Cited

U.S. PATENT DOCUMENTS

| | | | |
|---|---|---|---|
| 6,501,146 B1* | 12/2002 | Harada | 257/475 |
| 6,590,240 B1 | 7/2003 | Lanois | |
| 2002/0125541 A1* | 9/2002 | Korec et al. | 257/471 |
| 2004/0041225 A1* | 3/2004 | Nemoto | 257/458 |
| 2005/0029222 A1* | 2/2005 | Chen | 216/13 |
| 2007/0145414 A1* | 6/2007 | Francis et al. | 257/212 |
| 2010/0237456 A1 | 9/2010 | Qu et al. | |
| 2010/0259137 A1* | 10/2010 | Goerlach et al. | 310/68 D |
| 2011/0049564 A1* | 3/2011 | Guan et al. | 257/147 |
| 2013/0207222 A1* | 8/2013 | Qu et al. | 257/481 |

OTHER PUBLICATIONS

Nemoto et al., "Great Improvement in IGBT Turn-on Characteristics with Trench Oxide PiN Schottky (TOPS) Diode", Proceedings of 2001 International symposium on Power Semicondutor Device (2001): pp. 307-310.*

Chang et al., "1200 v, 50A Trench Oxide PiN Schottky (TOPS Diode)", IEEE (1999): pp. 353-358.*

International Search Report for PCT/EP2012/064146, dated Sep. 12, 2012.

Rajesh, et al., "A Novel Planarized, Silicon Trench Sidewall Oxide-Merged p-i-n Schottky Rectifier", IEEE Electron Device Letters, IEEE Service Center, New York, Bd. 20, No. 12, Dec. 1, 1999.

* cited by examiner

SUPER-JUNCTION SCHOTTKY PIN DIODE

BACKGROUND OF THE INVENTION

1. Field of the Invention

The present invention relates to a super-junction Schottky PIN oxide diode.

2. Description of the Related Art

Increasingly efficient current converters are becoming necessary with regard to issues associated with $CO_2$ emissions. Examples include inverters for photovoltaic or automotive applications. To this end, highly blocking, low-loss, quickly switching power semiconductors are necessary. In addition to active semiconductor switches such as IGBTs or CoolMOS transistors, freewheeling diodes are also required. For high-voltage applications, PIN diodes made of silicon are generally used. PIN diodes have small conducting-state voltages and low blocking currents, and therefore have low forward losses and blocking losses. However, high switching losses, which occur as switch-off losses during current commutation, are disadvantageous.

High-voltage PIN diodes are PN diodes in which an undoped (intrinsic), and in practice usually weakly doped, i layer is present between the p region and the n region. The blocking voltage is taken on primarily by the weakly doped i region. The space charge region extends mainly in the weakly doped region. The doping concentration and the thickness of this weakly doped region are determined by the predefined breakdown voltage. A high breakdown voltage means a low doping concentration and a large thickness of this weakly doped region. For a 600-V diode, the doping concentration of the i layer is approximately $3 \cdot 10^{14}$ cm$^{-3}$, and the layer thickness is approximately 50 microns.

High-level injection occurs in PIN diodes during flow operation with a high current density. In the process, electrons and holes are injected into the weakly doped region, and the concentration of the injected minority charge carriers exceeds the doping concentration of the weakly doped region. The conductivity of the weakly doped region is greatly increased as a result, and the voltage drop therefore remains low in the weakly doped middle region. For high currents, the forward voltage remains low. In contrast, no increase in the charge carrier density takes place for majority carrier components such as Schottky diodes. The weakly doped region represents a large ohmic resistor at which a correspondingly high voltage drops in the flow direction.

The charge carriers (electrons and holes), which are injected into the weakly doped region in the flow direction during the operation of PN or PIN diodes, must first be removed during switching off before the diode is able to take over blocking voltage. Therefore, during an abrupt current commutation the current initially continues to flow in the blocking direction until the stored charge carriers are removed or drained. This current is also referred to as drain current or reverse recovery current. The magnitude and duration of the drain current are determined primarily by the quantity of charge carriers stored in the weakly doped region. The more charge carriers that are present, the higher the drain current. A higher drain current means a higher switch-off power loss. Integration of the switch-off current over time results in reverse recovery charge Qrr, which is an important variable for describing the switch-off power loss, and which should be as small as possible. Switching times and switching losses are high for PIN diodes. Schottky diodes (metal-semiconductor contacts or silicide-semiconductor contacts) provide an improvement in the switching behavior. In Schottky diodes, no high-level injection takes place during flow operation, and therefore draining of the minority charge carriers is dispensed with. Schottky diodes switch rapidly and with practically no loss. However, for high blocking voltages, thick semiconductor layers with low-level doping are once again necessary, which for high currents results in unacceptable high forward voltages. For this reason, power Schottky diodes implemented in silicon technology, despite good switching behavior, are not suitable for blocking voltages above approximately 100 V.

Published German patent document DE 197 40 195 C2 describes a semiconductor element which is consistently referred to below as a Cool Schottky barrier diode (SBD). In this diode, as the result of introducing doped, alternatingly arranged p- and n-conductive pillars with a Schottky contact, it is possible to reduce the resistance to practically any desired level. When the pillar width is reduced, the pillar dopings may be increased. The doping of the p pillars and n pillars is selected in such a way that all dopant atoms are ionized when a blocking voltage is applied. This principle is also referred to as the superjunction (SJ) principle. Since a certain minority charge carrier injection takes place via the p-doped pillars, the ideal switching behavior of a pure Schottky diode is not achieved, but is greatly improved over that of a PIN diode. However, the low forward voltage of the PIN diode is not achieved for high currents. The superjunction principle is described, for example, in Japanese Journal of Applied Physics, Vol. 36, pages 6254-6262.

BRIEF SUMMARY OF THE INVENTION

The super-junction Schottky oxide PIN diode of the present invention has an n$^+$-doped substrate, above which an n-doped epilayer having trenches which are introduced into the epilayer, filled with p-doped semiconductor material and in each case having a highly p-doped region on their top side, is situated in such a way that an alternating arrangement of n-doped regions having a first width and p-doped regions having a second width is present, in addition at the front side of the semiconductor chip a first metal layer being provided which forms a Schottky contact with the n-doped epilayer and forms an ohmic contact with the highly p-doped regions and which is used as the anode electrode, and at the rear side of the semiconductor chip a second metal layer being provided which represents an ohmic contact and which is used as the cathode electrode, and a dielectric layer being provided in each case between an n-doped region and an adjacent p-doped region.

A high-blocking high-voltage diode having low forward voltage and favorable switching behavior is thus advantageously provided. A diode according to the present invention, also referred to as a super-junction Schottky oxide PIN diode, represents a combination of a Schottky diode with a PIN diode, which together form a superjunction structure and are galvanically separated from one another. In comparison to conventional PIN power diodes having similarly low forward voltages, a diode according to the present invention has much lower switch-off losses.

A diode according to the present invention represents a trench structure having Schottky diodes and PIN diodes connected in parallel, in which the Schottky regions and PIN regions are galvanically separated from one another and have charge carrier compensation, i.e., a superjunction structure. Due to the galvanic separation of the Schottky structure and the PIN structure, a high-level injection occurs in the PIN regions. For practically identical switch-off losses, the forward voltage is lower than for a known Cool SBD.

In comparison to a high-voltage PIN diode, a diode according to the present invention has a much smaller switch-off power loss for a comparable forward voltage and high current densities.

Compared to a Cool SBD, a diode according to the present invention has a lower forward voltage at high current density, and only a negligibly higher switch-off power loss.

The present invention is explained in greater detail below with reference to the drawing.

DETAILED DESCRIPTION OF THE INVENTION

Figure 1:
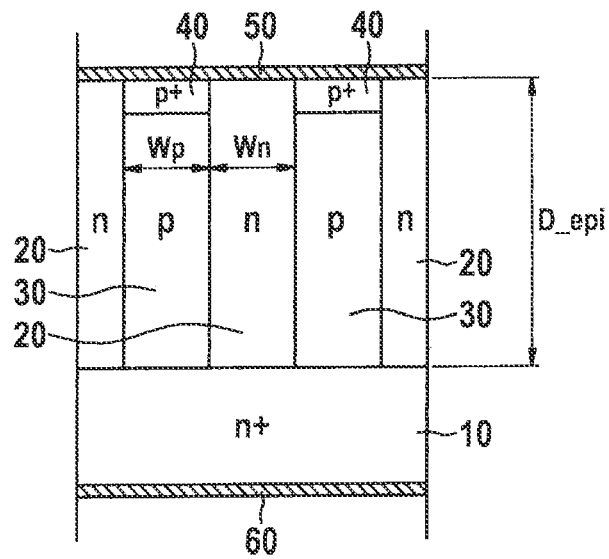
FIG. 1 shows a cross-sectional illustration of a detail of a known Cool SBD.

FIG. 1 illustrates a detail of the structure of a Cool SBD corresponding to the related art, in cross section. The Cool SBD is composed of an $n^+$ substrate 10 on which an n-epilayer 20 having thickness D_epi and doping concentration ND is arranged. n-epilayer 20 contains etched-in trenches 30 which are filled with p-doped silicon having doping concentration NA, and which in the upper regions are filled with $p^+$-doped silicon 40. The width of n regions 20 is Wn, and the width of p and $p^+$ regions 30 and 40, respectively, is Wp. Dopings and widths are selected in such a way that the regions are depleted when the full blocking voltage is applied (superjunction principle). This is the case, for example, for $NA \cdot Wp = ND \cdot Wn = 10^{12}$ $cm^{-2}$. On the front side of the chip, n-doped regions 20 and $p^+$-doped regions 40 are covered by a continuous first metal layer 50, which with n-doped regions 20 forms a Schottky contact, and with $p^+$-doped regions 40 forms an ohmic contact. Metal layer 50 represents the anode contact of the diode. The barrier height of Schottky diode 50-20 may be set by selecting an appropriate metal 50. For example, nickel or NiSi may be used as metal layer 50. Additional metal layers, not illustrated, may optionally be present above functional layer 50 in order to make the surface solderable or bondable, for example. A second metal layer 60 is present on the rear side of the chip, and represents the ohmic contact with highly $n^+$-doped substrate 10. This layer or layer sequence is usually suitable for soldering or some other assembly, and may be composed of a sequence of Cr/NiV and Ag, for example. Second metal layer 60 forms the cathode terminal.

The structure shown is a parallel circuit of a Schottky diode and a PIN diode. Metal contact 50 together with n-doped pillars 20 forms Schottky diodes. The PIN structure is formed by the layer sequence composed of $p^+$ region 40, p region 30, and substrate 10 as a $p^+/p/n^+$ structure.

The p- and n-doped pillars are depleted when the blocking voltage is applied. The doping, at least up to a certain limit which results in the space charge regions colliding even at low voltage, may be increased with decreasing width Wp and Wn. This reduces the bulk resistance of Schottky diodes 50-20-10 in the flow direction. The forward voltages are therefore lower than in a simple Schottky diode, which at the same blocking voltage has lower doping. In addition, some current still flows through the PIN diodes in the flow direction. As a result, the forward voltage is further reduced. However, the minority charge carriers must once again be drained during switch-off, with disadvantageous effects for the switching time.

Figure 2:
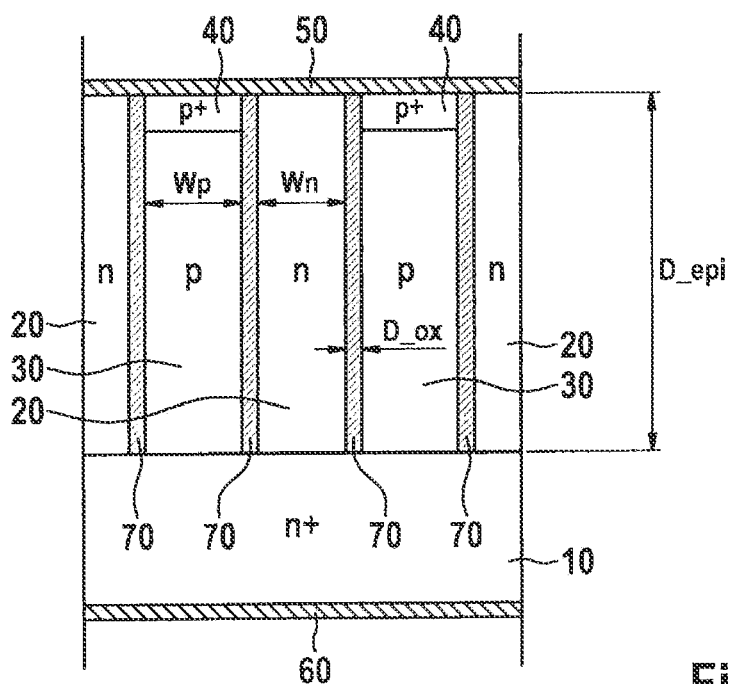
FIG. 2 shows a cross-sectional illustration of a detail of a diode according to the present invention.

One exemplary embodiment of a super-junction Schottky oxide PIN diode (SJSOP) according to the present invention is illustrated in a detail in cross section in FIG. 2. The SJSOP is composed of an $n^+$ substrate 10 on which an n-epilayer 20 having thickness D_epi is arranged. n-epilayer 20 contains etched-in trenches 30 which are filled with p-doped silicon and at the top side are filled with $p^+$-doped silicon 40. The width of n regions 20 is Wn, and the width of p and $p^+$ regions 30 and 40, respectively, is Wp. Once again, the doping concentrations and widths are selected in such a way that the superjunction principle applies. In contrast to an arrangement according to FIG. 1, dielectric layers 70, preferably $SiO_2$ layers having a thickness D_ox, are present between the $p/p^+$ regions and the n regions. As a result, the p regions and n regions are no longer directly galvanically connected. On the front side of the chip, n-doped regions 20 and $p^+$-doped regions 40 are covered with a continuous metal layer 50, which with n-doped regions 20 forms a Schottky contact, and with $p^+$-doped regions 40 forms an ohmic contact. Metal layers 50 and 60 once again represent the anode contact and cathode contact, respectively, of the diode. The design and function correspond to the arrangement according to FIG. 1.

The principle and the advantage of the structure according to the present invention according to FIG. 2 are compared to the known structure according to FIG. 1, using the example of 600-V diodes. For this purpose, components made of silicon, having an active chip surface area of 26 $mm^2$ and a chip thickness of 200 μm, are considered. The doping of substrate 10 is $10^{19}$ $cm^{-3}$. Doping concentration NA of n-doped regions or pillars 20 and of p-doped regions or pillars 30 is identical ($10^{16}$ $cm^{-3}$). The alternatingly arranged n- and p-pillars have a thickness D_epi of 35 μm. Corresponding widths Wp and Wn are each 1 μm. $p^+$ doping 40 is a Gaussian distribution having a surface concentration of $5 \cdot 10^{19}$ $cm^{-3}$ with a penetration depth of approximately 0.5 μm. The barrier of the Schottky contact, which is formed from front-side metal 50 and n-doped pillars 20, is 0.72 eV. Oxide layers 70 which are additionally present in the structure according to the present invention have a thickness D_ox of 50 nm.

The Cool SBD and the SJSOP are also compared to a 600-V PIN diode having the same surface area and chip thickness. The n-doped epi thickness is 52 μm and has a doping concentration of $3.1 \cdot 10^{14}$ $cm^{-3}$. The p-doped anode once again has a Gaussian distribution having a surface concentration of $5 \cdot 10^{19}$ $cm^{-3}$ with a penetration depth of 5 μm.

At comparable breakdown voltages (650 V), the blocking currents of the SJSOP and the Cool SBD are comparable, but due to the selected Schottky barrier are one to two orders of magnitude higher than for the PIN diode.

Figure 3:
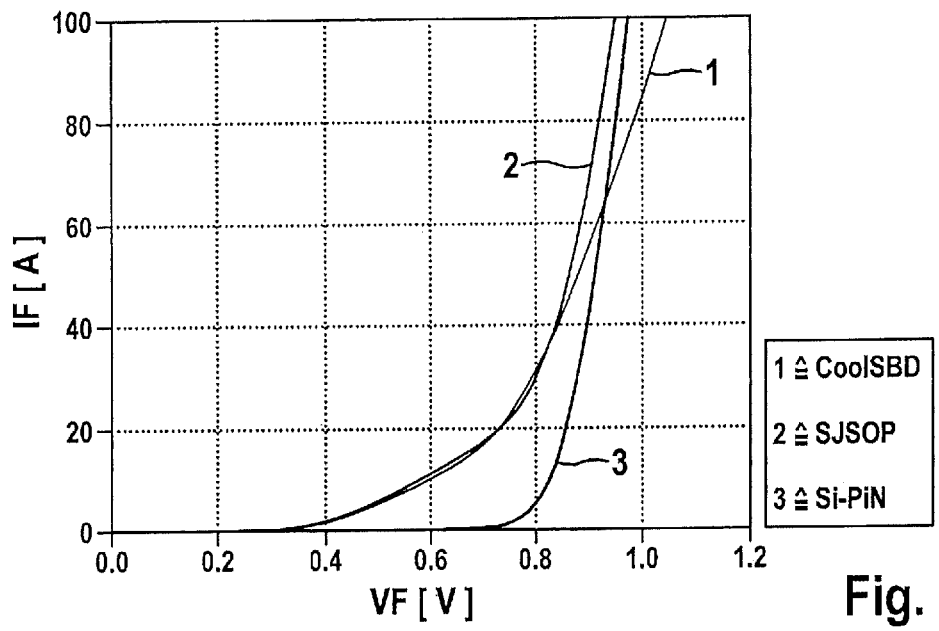
FIG. 3 shows a diagram in which conducting-state characteristics are illustrated.

The conducting-state voltages of an SJSOP, measured at high currents, for example at 100 A, are comparable to the PIN diode, but are lower than for the known Cool SBD. This is illustrated in FIG. 3, in which forward voltage VF is plotted along the abscissa and forward current IF is plotted along the ordinate.

Figure 4:
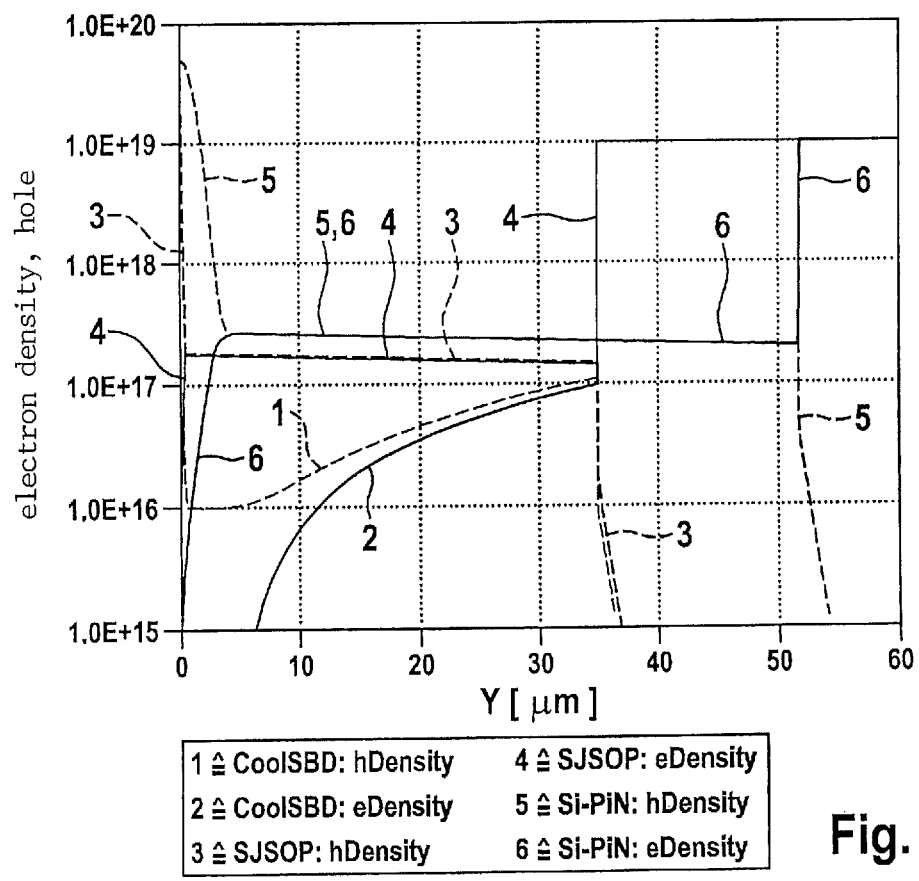
FIG. 4 shows a diagram in which charge carrier distributions in the p-doped epilayer are illustrated.
Figure 5:
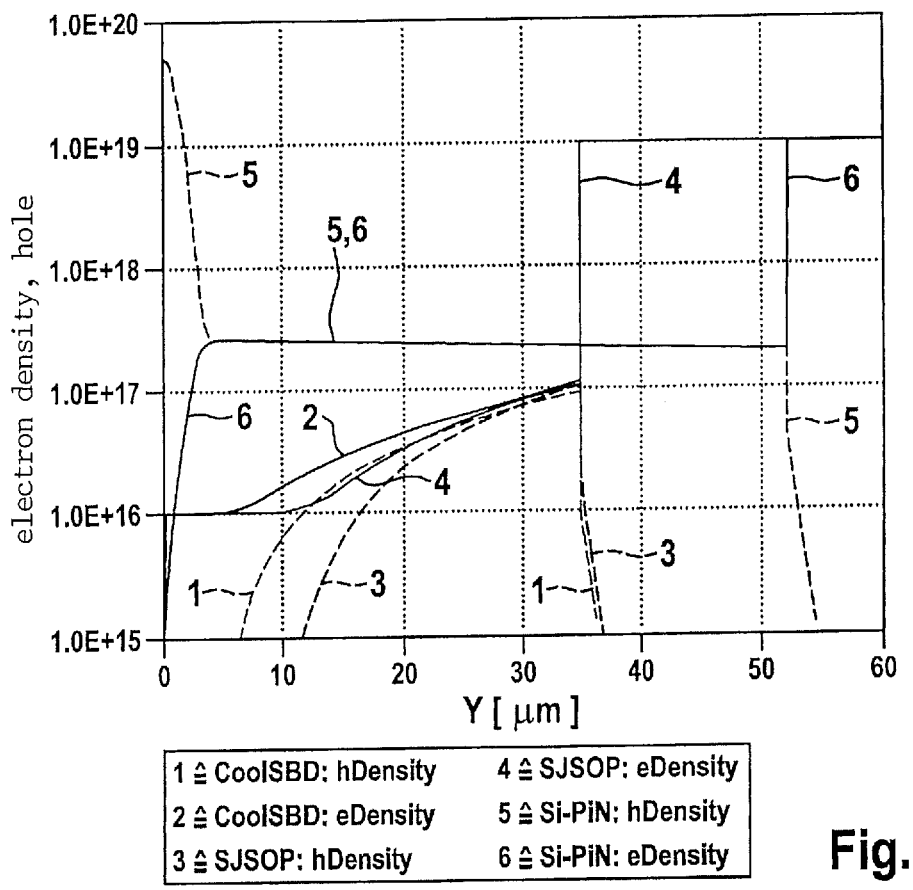
FIG. 5 shows a diagram in which charge carrier distributions in the n-doped epilayer are illustrated.

The improved behavior of the SJSOP in the conducting direction may be explained by the surprising finding that in the novel structure, in contrast to the Cool SBD, high-level injection prevails over the entire p-doped pillar, exactly as for a PIN diode. Oxide layers 70 prevent drainage of charge carriers into adjacent n-doped regions 20. Drained charge carriers are no longer available for high-level injection. The reason for the charge shift in a Cool SBD is the different threshold voltages of Schottky diode 50-20 on the one hand and of PIN diode 30-10 on the other hand. A prerequisite is that the threshold voltage of the Schottky diode is lower than that of the PIN diode. The computed charge carrier distributions in the p- and n-doped regions are illustrated in FIGS. 4 and 5. Vertical extent Y, beginning at the lower edge of first metal layer 50, is plotted along the abscissa, and the electron density (eDensity) and the hole density (hDensity) are plotted along the ordinate in each of FIGS. 4 and 5. It is apparent that there are hardly any differences between the Cool SBD and the SJSOP in the n region, but in the novel SJSOP the entire p region is flooded with electrons and holes.

Figure 6:
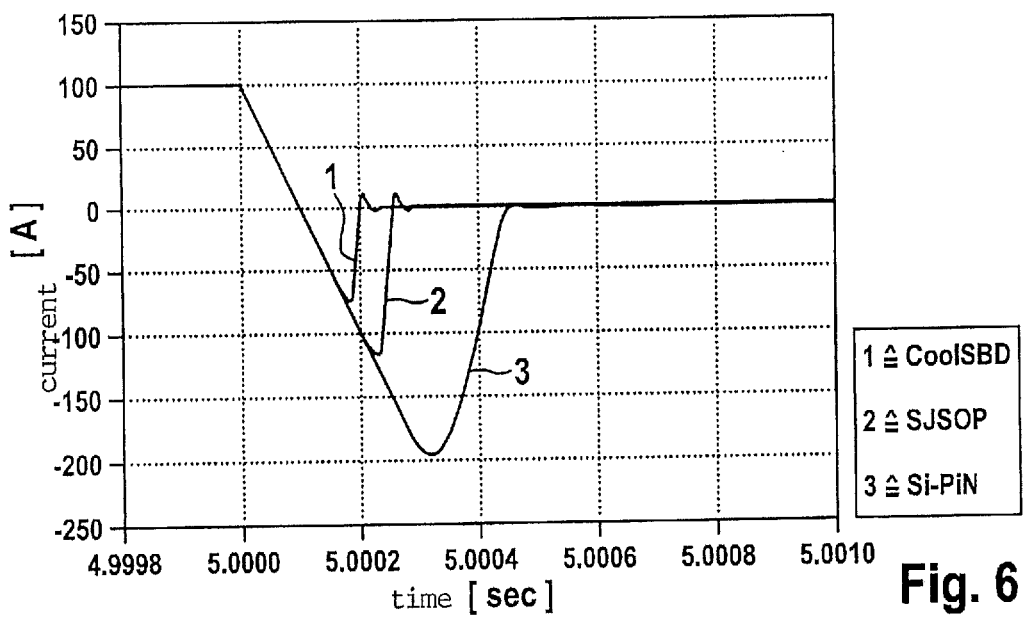
FIG. 6 shows a diagram in which the switch-off behavior is illustrated.

Due to the higher minority charge carrier concentration (electrons in weakly p-doped regions 30), the switching behavior of a diode according to the present invention is slightly less favorable than for the Cool SBD, but it is much better than for a PIN diode. This is illustrated in FIG. 6, in which time is plotted along the abscissa and current is plotted along the ordinate.

Figure 7:
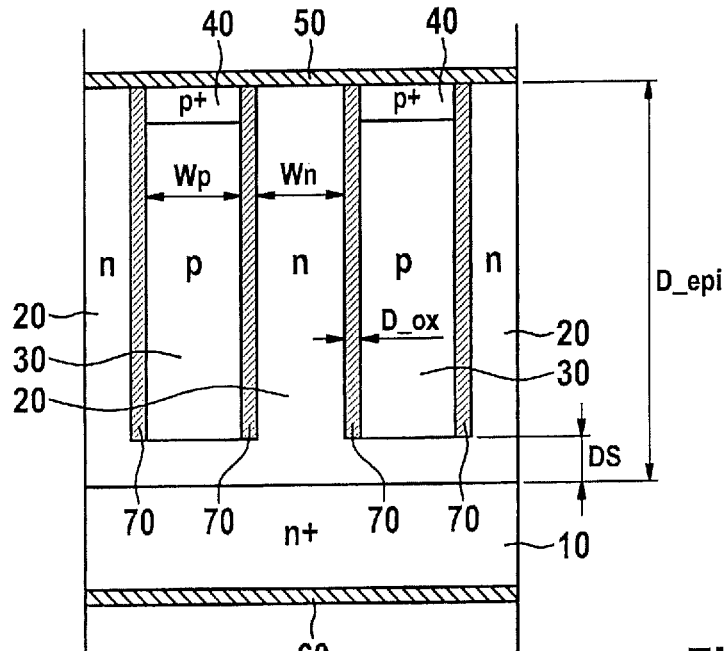
FIG. 7 shows a cross-sectional illustration of a detail of a diode according to the present invention according to a second exemplary embodiment.

A cross-sectional illustration of a detail of a diode according to the present invention according to a second exemplary embodiment is shown in FIG. 7. In contrast to the arrangement according to FIG. 2, p-doped regions 30 and oxide layers 70 do not end at n/n$^+$ transition 20-10, but, rather, end at a certain distance DS above same.

Figure 8:
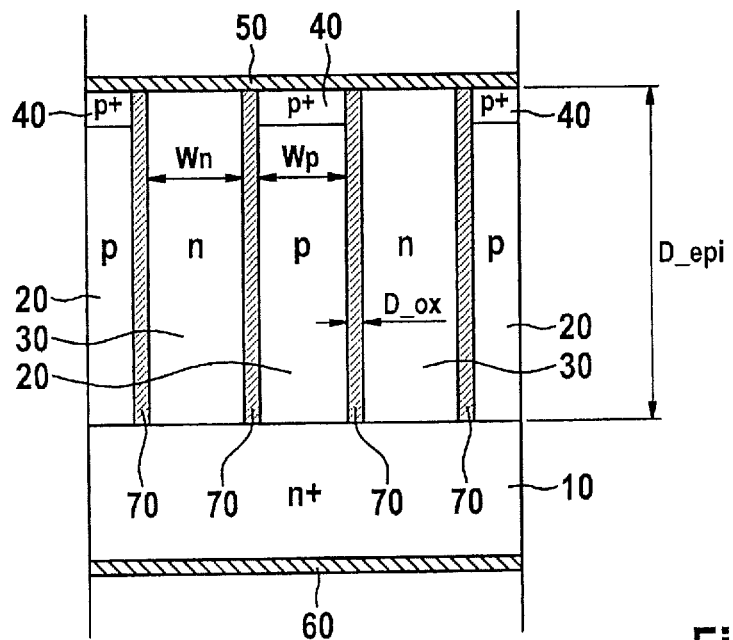
FIG. 8 shows a cross-sectional illustration of a detail of a diode according to the present invention according to a third exemplary embodiment.

In principle, the present invention is not limited to trenches filled with p-doped semiconductor material in an n-doped epilayer. Instead of the n-doped epilayer, it is possible, as is apparent from FIG. 8 which shows a third exemplary embodiment of the present invention, for a p-doped epilayer 20, which has a highly p-doped region 40 at the surface and into which trenches 30 filled with n-doped semiconductor material are introduced, to also be present. Once again the n- and p-doped regions are galvanically separated by a dielectric layer 70. The filled n-doped layer at the base of trench 30 must be galvanically connected to highly n-doped substrate 10.

Figure 9:
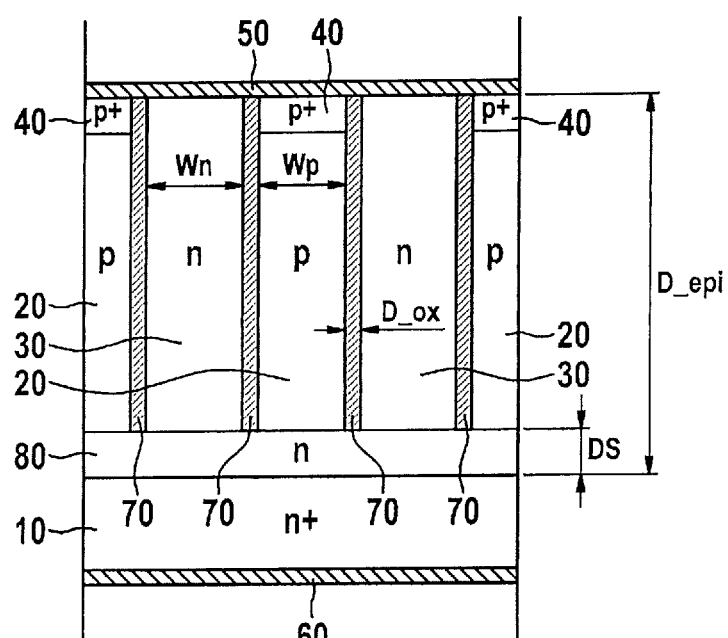
FIG. 9 shows a cross-sectional illustration of a detail of a diode according to the present invention according to a fourth exemplary embodiment.

For the case that p-doped epilayer 20, similar to FIG. 7, ends not at highly n-doped substrate 10, but instead at a distance DS from same, a further n-doped layer 80 to which filled n-doped layer 30 is connected must also be present between p-doped epilayer 20 and highly n-doped substrate 10. This is illustrated in FIG. 9, which shows a fourth exemplary embodiment of the present invention.

What is claimed is:

1. A semiconductor chip, comprising:
   an n$^+$-doped substrate;
   an n-doped epilayer provided above the n$^+$-doped substrate, wherein the n-doped epilayer has trenches which are each filled with a p-doped semiconductor material having a highly p-doped region at the top portion of the respective trench, the trenches being situated in such a way that an alternating arrangement of n-doped epilayer regions having a first width and p-doped regions having a second width is present;
   a first metal layer provided on a top side of the semiconductor chip, wherein the first metal layer forms a Schottky contact with the n-doped epilayer regions and forms an ohmic contact with the highly p-doped regions, and wherein the first metal layer functions as the anode;
   a second metal layer provided on a bottom side of the semiconductor chip, wherein the second metal layer provides an ohmic contact and functions as the cathode;
   a dielectric layer provided laterally between each n-doped epilayer region and an adjacent p-doped region;
   wherein a combination of a Schottky diode with a PIN diode is present, and wherein the Schottky diode and the PIN diode together form a superjunction structure and are galvanically separated from one another, a high-level injection taking place in the PIN diode in the conducting direction;
   wherein the respective width and the respective doping of the n-doped epilayer and of the p-doped trenches are selected in such a way that the n-doped epilayer regions and the p-doped regions are completely depleted when the maximum blocking voltage is present.

2. The semiconductor chip as recited in claim 1, wherein the bottom side of each of the trenches filled with the p-doped semiconductor material is contacted with the n+-doped substrate.

3. The semiconductor chip as recited in claim 1, wherein the bottom side of each of the trenches filled with the p-doped semiconductor material is separated from the n+ substrate by a predefined distance.

4. The semiconductor chip as recited in claim 1, wherein the dielectric layer is a silicon dioxide layer.

5. The semiconductor chip as recited in claim 1, wherein:
   the first width of the n-doped regions and the second width of the p-doped regions are in the range of 1 µm to 4 µm;
   the depths of the n-doped regions and the p-doped regions are in the range of 30 µm to 80 µm; and
   the width of the dielectric layer is in the range of 10 nm to 100 nm.

6. The semiconductor chip as recited in claim 1, wherein the p-doped trenches are arranged in the form of one of strips or islands.

7. The semiconductor chip as recited in claim 6, wherein the p-doped trenches are etched into the n-doped epilayer.

8. The semiconductor chip as recited in claim 6, wherein the semiconductor chip is implemented in a press-fit diode housing.

9. The semiconductor chip as recited in claim 6, wherein the semiconductor chip is an integral part of a rectifier of a motor vehicle generator.

* * * * *